United States Patent
Xue et al.

(10) Patent No.: US 10,985,219 B2
(45) Date of Patent: Apr. 20, 2021

(54) DISPLAY DEVICE

(71) Applicant: Kunshan Go-Visionox Opto-Electronics Co., Ltd., Kunshan (CN)

(72) Inventors: Xiaofei Xue, Kunshan (CN); Bo Jin, Kunshan (CN); Zhihua Zhang, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 74 days.

(21) Appl. No.: 16/265,778

(22) Filed: Feb. 1, 2019

(65) Prior Publication Data
US 2019/0181192 A1   Jun. 13, 2019

Related U.S. Application Data

(63) Continuation of application No. PCT/CN2018/106945, filed on Sep. 21, 2018.

(30) Foreign Application Priority Data

Jan. 19, 2018  (CN) .......................... 201820089105.2

(51) Int. Cl.
*H01L 27/32* (2006.01)
*H01L 51/52* (2006.01)
(Continued)

(52) U.S. Cl.
CPC ...... *H01L 27/3227* (2013.01); *G02F 1/13338* (2013.01); *G02F 1/133512* (2013.01);
(Continued)

(58) Field of Classification Search
None
See application file for complete search history.

(56) References Cited

U.S. PATENT DOCUMENTS 6,573,956 B1 * 6/2003 Shibata ............. G02F 1/133615
349/58
8,872,797 B2 * 10/2014 Lee .................... H01L 27/3211
345/175
(Continued)

FOREIGN PATENT DOCUMENTS

CN   103472941 A   12/2013
CN   103680425 A   3/2014
(Continued)

OTHER PUBLICATIONS

Espacenet English machine translation of CN106412159A (Year: 2017).*
(Continued)

*Primary Examiner* — Edward J Glick
*Assistant Examiner* — David Y Chung

(57) ABSTRACT

A display device includes a cover plate, a display screen and a photoreceptor, the cover plate is disposed on the display screen, and the cover plate is provided with a light shielding layer. The light shielding layer is provided with a light transmitting area, and the photoreceptor is disposed corresponding to the light transmitting area. The display device of the present application can improve the photographic properties and the accuracy of the photoreceptor, and make it easier to assemble, and reduce assembly steps.

13 Claims, 2 Drawing Sheets

(51) Int. Cl.
*G02F 1/1333* (2006.01)
*H05K 1/18* (2006.01)
*G02F 1/1335* (2006.01)

(52) U.S. Cl.
CPC ........ *H01L 51/524* (2013.01); *H01L 51/5246* (2013.01); *H01L 51/5284* (2013.01); *H05K 1/189* (2013.01); *H05K 2201/10128* (2013.01)

(56) References Cited

U.S. PATENT DOCUMENTS

| | | | |
|---|---|---|---|
| 9,429,803 B2 | 8/2016 | Park et al. | |
| 2008/0198297 A1* | 8/2008 | Choi | G02B 6/0083 349/65 |
| 2010/0157574 A1* | 6/2010 | Shin | G02B 6/0091 362/97.1 |
| 2013/0048837 A1 | 2/2013 | Pope | |
| 2014/0192392 A1 | 7/2014 | Cammenga et al. | |
| 2016/0212311 A1 | 7/2016 | Mathew et al. | |
| 2017/0179423 A1* | 6/2017 | Kwon | H01L 51/5237 |
| 2019/0088234 A1* | 3/2019 | Xu | G02B 5/285 |

FOREIGN PATENT DOCUMENTS

| | | |
|---|---|---|
| CN | 104536179 A | 4/2015 |
| CN | 105047691 A | 11/2015 |
| CN | 106412159 | 2/2017 |
| CN | 106412159 A | 2/2017 |
| CN | 106918945 A | 7/2017 |
| CN | 206559729 U | 10/2017 |
| JP | 2017-48090 A | 3/2017 |
| JP | 2017-530401 A | 10/2017 |
| KR | 10-2012-0046040 A | 5/2012 |
| WO | 2017054108 A1 | 4/2017 |

OTHER PUBLICATIONS

Written Opinion of PCT/CN2018/106945 dated Nov. 5, 2018.
International Search Report of PCT/CN2018/106945 dated Nov. 5, 2018.
Japanese Notice of Reasons for Refusal in Application No. 2019-564127 dated Oct. 6, 2020.
European Search Report in European Application No. 18900932.7 dated Jun. 12, 2020.
Korean Notification of Reason for Refusal in Application No. 10-2019-7033953 dated Sep. 22, 2020.

\* cited by examiner

DISPLAY DEVICE

CROSS-REFERENCE TO RELATED APPLICATIONS

This application is a continuation of International Application No. PCT/CN2018/106945 filed on Sep. 21, 2018, which claims priority to Chinese patent application No. 201820089105.2 filed on Jan. 19, 2018. Both applications are incorporated herein by reference in their entireties.

TECHNICAL FIELD

The present application relates to the field of display technologies, particularly to a display device.

BACKGROUND

Liquid Crystal Display (LCD) and Organic Light-Emitting Display (OLED) have been widely used in a desktop computer, a notebook computer, a personal digital assistant (PDA), a mobile phone, a television and other fields because of their characteristics such as low radioactivity, light volume, low weight, low power consumption and the like.

As for the liquid crystal display, the liquid crystal display mainly includes a liquid crystal display panel and a backlight module. The backlight module provides a backlight for the liquid crystal display panel, and a light emitted by the backlight is uniformly emitted into the liquid crystal display panel by the backlight module through an optical film in order to make the liquid crystal display panel display an image. In order to save electric energy, it is necessary to dispose a photoreceptor in the liquid crystal display to sense the external environment light, which can achieve to adjust the display brightness of the liquid crystal display panel according to the intensity of the external environment light.

The prior photoreceptor is disposed on a back of the liquid crystal display panel. That is, an opening is disposed in a foam layer on the back of the liquid crystal display panel, a flexible circuit board is bent to the opening, the flexible circuit board is fixed on the foam layer by utilizing a double-sided tape, and the photoreceptor is located in the opening. Therefore, the external environment light can be sensed by the photoreceptor after passing through a cover plate, OCA, POL, and the liquid crystal display panel, and thereby the display brightness of the liquid crystal display panel is adjusted. However, due to the limitations of various components, parts, middle frames, mainboards and the like on the back of the liquid crystal display panel, an arrangement space of the photoreceptor is insufficient, thus a bonding area of the flexible circuit board is small, and the flexible circuit board is easily detached, which causes the reliability of the photoreceptor to be reduced. Furthermore, the external environment light needs to pass through multi-layer parts to be sensed by the photoreceptor, which affects the photosensitive effect of the photoreceptor. In addition, there are many parts and many assembly processes of the prior liquid crystal display, which increases the assembly difficulty.

As for the organic light-emitting display, the organic light-emitting display mainly includes an array substrate, and an anode, a hole injection layer, a hole transport layer, an organic light-emitting layer, an electron transport layer, an electron injection layer and a cathode, which are disposed on the array substrate. When electrons and holes recombine at the organic light-emitting layer, the organic light-emitting display performs image display. In order to save electric energy, it is necessary to dispose a photoreceptor in the organic light-emitting display to sense the external environment light, which can achieve to adjust the display brightness of the organic light-emitting display according to the intensity of the external environment light.

The prior photoreceptor is disposed on a back of the organic light-emitting display, and the external environment light can be sensed by the photoreceptor after passing through a cover plate, the anode, the hole injection layer, the hole transport layer, the organic light-emitting layer, the electron transport layer, the electron injection layer, the cathode and the array substrate, and thereby the display brightness of the organic light-emitting display is adjusted.

However, due to the limitations by various components, parts, middle frames, mainboards and the like on the back of the organic light-emitting display, an arrangement space of the photoreceptor is insufficient, thus a bonding area of a flexible circuit board connected to the photoreceptor is small, and the flexible circuit board is easily detached, which causes the reliability of the photoreceptor to be reduced. Furthermore, the external environment light needs to pass through multi-layer parts to be sensed by the photoreceptor, which affects the photosensitive effect of the photoreceptor. In addition, there are many parts and many assembly processes of the prior organic light-emitting display, which increases the assembly difficulty.

SUMMARY

The purpose of the present application is to provide a display device, which can improve the photographic properties and the accuracy of a photoreceptor, be easier to be assembled, and reduce assembly steps.

The technical problems solved by the present application are achieved by the following technical solutions.

A display device includes a cover plate, a display screen and a photoreceptor, the cover plate is disposed on the display screen, the cover plate is provided with a light shielding layer, the light shielding layer is provided with a light transmitting area, and the photoreceptor is disposed corresponding to the light transmitting area.

In a preferred embodiment of the present application, the display device further includes a control assembly, the control assembly includes a flexible circuit board, one end of the flexible circuit board is disposed on the light shielding layer, and the photoreceptor is located between the flexible circuit board and the cover plate and connected to the flexible circuit board.

In a preferred embodiment of the present application, the flexible circuit board is provided with a double-sided tape, one side of the double-sided tape is connected to the flexible circuit board, and the other side of the double-sided tape is connected to the cover plate.

In a preferred embodiment of the present application, the double-sided tape is rectangular, and the photoreceptor is located in a region surrounded by the double-sided tape.

In a preferred embodiment of the present application, the cover plate includes a display area and a non-display area, the display area is located in an intermediate region of the cover plate, a light of an image displayed by the display screen is emitted from the display area of the cover plate, the non-display area is disposed around the display area, and the light shielding layer is disposed in the non-display area.

In a preferred embodiment of the present application, the double-sided tape is a foam tape.

In a preferred embodiment of the present application, the cover plate is provided with a groove, the groove is located in the light transmitting area, and one side of the photoreceptor away from the flexible circuit board is located in the groove.

In a preferred embodiment of the present application, the light shielding layer includes a light semi-transmitting layer, and the light semi-transmitting layer is disposed in the light transmitting area.

In a preferred embodiment of the present application, a groove wall and a groove bottom of the groove are provided with the light semi-transmitting layer.

In a preferred embodiment of the present application, the light shielding layer further includes an ink layer, and the ink layer is disposed around a circumferential direction of the light semi-transmitting layer.

In a preferred embodiment of the present application, the control assembly further includes a control panel, and the display screen and the flexible circuit board are electrically connected to the control panel respectively.

A cover plate of a display device provided by the present application is disposed on a display screen, the cover plate is provided with a light shielding layer, the light shielding layer is provided with a light transmitting area, and a photoreceptor is disposed corresponding to the light transmitting area. Since the photoreceptor is disposed under the cover plate, the environment light can be sensed by the photoreceptor only after penetrating the cover plate of the display device, which improves the photographic properties and the accuracy of the photoreceptor, makes it easier to assemble, and reduces assembly steps.

The forgoing description is only a summary of technical solutions of the present application. In order to make technical means of the present application be more clearly understood, and be implemented according to contents of the specification, and in order to make the forgoing and other purposes, features and advantages of the present application more apparent, the preferred embodiments are described in detail below with reference to the accompanying drawings.

DETAILED DESCRIPTION

In order to further illustrate technical means and effects adopted by the present application for reaching intended application purposes, specific embodiments, structures, features and effects of a display device according to the present application will be described in detail below with reference to the accompanying drawings and preferred embodiments.

The forgoing and other technical contents, features and effects of the present application will be apparent from the following detailed description of the preferred embodiments in conjunction with the accompanying drawings. The technical means and effects adopted by the present application for reaching intended purposes may be more deeply and specifically understood through the description of the specific embodiments. However, the accompanying drawings are only for the purpose of reference and description, and are not intended to limit the present application.

Figure 1:
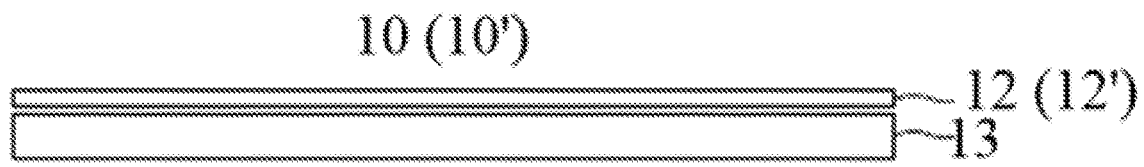
FIG. 1 is a schematic diagram illustrating a display device according to an embodiment of the present application.

FIG. 1 is a schematic diagram illustrating a display device according to an embodiment of the present application. As shown in FIG. 1, the display device 10 (10') includes a cover plate 12 (12'), a display screen 13 and a control assembly. In this embodiment, the cover plate 12 (12') is disposed on the display screen 13; and the control assembly is electrically connected to the display screen 13, and the control assembly is configured to control the display screen 13 to perform image display and the brightness of the display screen 13.

It is worth mentioning that the display screen 13 of the present application is a liquid crystal display screen or an OLED display screen, which can be freely selected according to actual needs. For example, when the display screen 13 is the liquid crystal display screen, the control assembly can control the backlight brightness of the liquid crystal display screen; and when the display screen 13 is the OLED display screen, the control assembly can control the self-luminous brightness of the OLED display screen.

Figure 2:
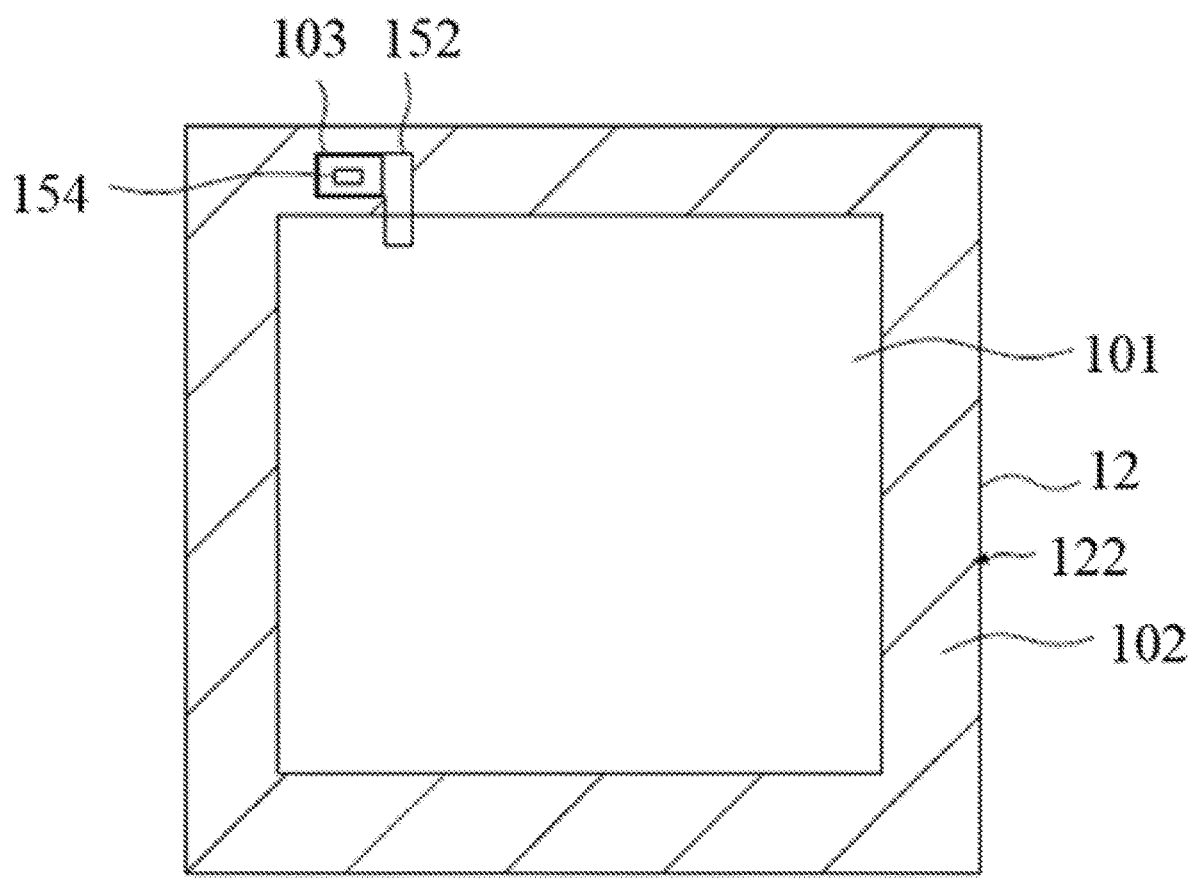
FIG. 2 is a local plane schematic diagram illustrating a display device according to a first embodiment of the present application.
Figure 3:
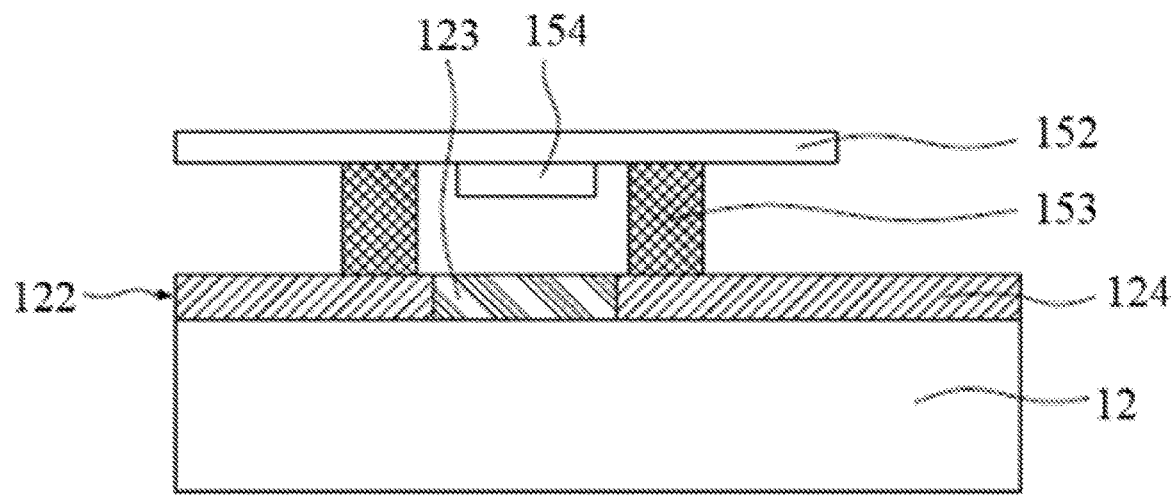
FIG. 3 is a local section schematic diagram illustrating the display device in FIG. 2.

FIG. 2 is a local plane schematic diagram illustrating a display device according to a first embodiment of the present application. FIG. 3 is a local section schematic diagram illustrating the display device in FIG. 2. As shown in FIG. 2 and FIG. 3, the cover plate 12 includes a display area 101 and a non-display area 102. The display area 101 is located in an intermediate region of the cover plate 12, and a light of an image displayed by the display screen 13 can be emitted from the display area 101 of the cover plate 12. The non-display area 102 is located in an edge region of the cover plate 12, that is, the non-display area 102 is disposed around a circumferential direction of the display area 101, and a light shielding layer 122 for shielding light is disposed in the non-display area 102.

Further, a locality of the light shielding layer 122 is provided with a light transmitting area 103 that may be partially transparent. That is, the light can enter the display device 10 through the light transmitting area 103 of the light shielding layer 122 or be emitted from the display device 10 through the light transmitting area 103 of the light shielding layer 122. The light shielding layer 122 includes a light semi-transmitting layer 123 and an ink layer 124, the light semi-transmitting layer 123 is disposed in the light transmitting area 103, and the ink layer 124 is disposed around a circumferential direction of the light semi-transmitting layer 123. That is, most regions of the non-display area 102 of the cover plate 12 are provided with the ink layer 124, and a local region of the non-display area 102 (the light transmitting area 103 of the light shielding layer 122) is provided with the light semi-transmitting layer 123. In this embodiment, the ink layer 124 can completely block the light from entering the display device 10; the light semi-transmitting layer 123 can allow part of the light to enter the display device 10, and thus the effect of hiding a device can be realized.

The control assembly includes a control panel (not shown) and a flexible circuit board 152 (FPC). The control panel is provided with components such as a timing control chip, a power supply, a driver chip, a connector, a system connector and the like, and the control panel is electrically connected to the display screen 13. One end of the flexible circuit board 152 is connected to the control panel, and the other end of the flexible circuit board 152 is disposed on the light shielding layer 122 of the cover plate 12. The flexible circuit board 152 is provided with a double-sided tape 153 and a photoreceptor 154; and one side of the double-sided tape 153 is connected to the flexible circuit board 152, and the other side of the double-sided tape 153 is connected to the light shielding layer 122 of the cover plate 12. The photoreceptor 154 is connected to the flexible circuit board 152, that is, the photoreceptor 154 is located between the cover plate 12 and the flexible circuit board 152, and the photoreceptor 154 is disposed corresponding to the light transmitting area 103. Therefore, the photoreceptor 154 can sense the intensity of the external environment light, and then the brightness of the display screen 13 can be controlled through the control panel, that is, the adjustment of the image brightness of the display screen 13 can be achieved. In this embodiment, the double-sided tape 153 is a foam tape (not limited to this), the double-sided tape 153 is rectangular, and the photoreceptor 154 is located in a region surrounded by the double-sided tape 153.

The display device 10 of the present application can sense the intensity of the environment light through the photoreceptor 154, and since the photoreceptor 154 is disposed under the cover plate 12, the environment light can be sensed by the photoreceptor 154 only after penetrating the cover plate 12 of the display device 10, which improves the photographic properties of the photoreceptor 154. Furthermore, there are fewer elements on the light shielding layer 122 of the cover plate 12, a sufficient bonding area is provided for the double-sided tape 153, and the flexible circuit board 152 can be firmly fixed to the cover plate 12. Thus, the reliability of the photoreceptor 154 can be improved. In addition, the non-display area 102 of the cover plate 12 has a large space, and an assembly is easier to be performed. Thus, not only the assembly steps are reduced, but also the accuracy of the photoreceptor 154 is improved.

Figure 4:
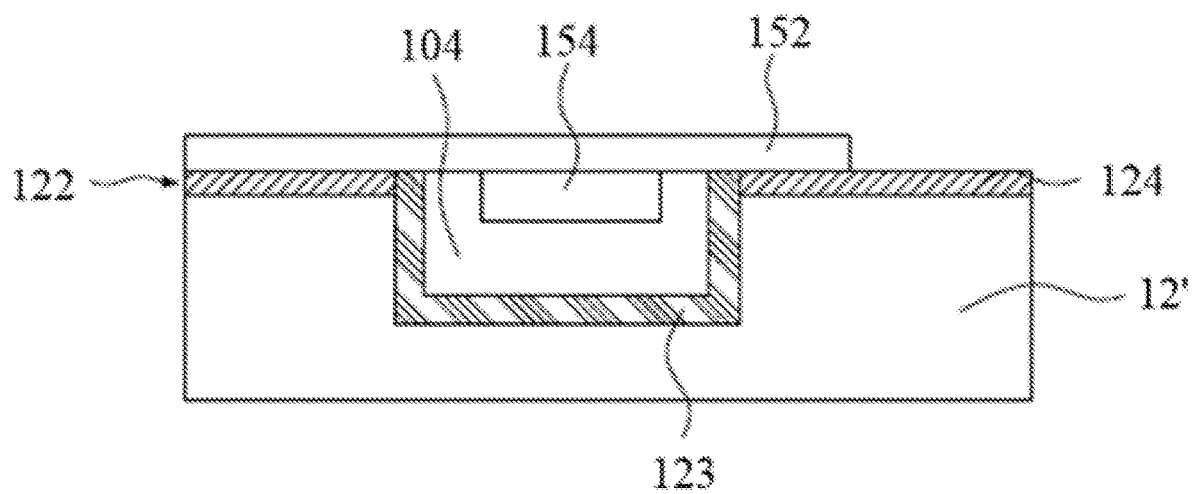
FIG. 4 is a local section schematic diagram illustrating a display device according to a second embodiment of the present application.

FIG. 4 is a local section schematic diagram illustrating a display device according to a second embodiment of the present application. As shown in FIG. 4, the display device 10' of the present application has approximately the same structure as the display device 10 of the first embodiment, and the difference is the structure of a cover plate 12'.

Specifically, the cover plate 12' includes a display area 101 and a non-display area 102. The display area 101 is located in an intermediate region of the cover plate 12', and a light of an image displayed by a display screen 13 can be emitted from the display area 101 of the cover plate 12'. The non-display area 102 is located in an edge region of the cover plate 12', that is, the non-display area 102 is disposed around the circumferential direction of the display area 101, and a light shielding layer 122 for shielding light is disposed in the non-display area 102.

The locality of the light shielding layer 122 is provided with a light transmitting area 103 that may be partially transparent, that is, the light can enter the display device 10' through the light transmitting area 103 of the light shielding layer 122 or be emitted from the display device 10' through the light transmitting area 103 of the light shielding layer 122. The light shielding layer 122 includes a light semi-transmitting layer 123 and a ink layer 124, the light semi-transmitting layer 123 is disposed in the light transmitting area 103, and the ink layer 124 is disposed around the circumferential direction of the light semi-transmitting layer 123. That is, most regions of the non-display area 102 of the cover plate 12' are provided with the ink layer 124, and a local region of the non-display area 102 (the light transmitting area 103 of the light shielding layer 122) is provided with the light semi-transmitting layer 123. In this embodiment, the ink layer 124 can completely block the light from entering the display device 10'; the light semi-transmitting layer 123 can allow part of the light to enter the display device 10', and thus the effect of hiding a device can be realized.

Further, the cover plate 12' is provided with a groove 104, the groove 104 is located in the light transmitting area 103, and one side of a photoreceptor 154 away from a flexible circuit board 152 is located in the groove 104. In this embodiment, the flexible circuit board 152 is directly connected to the cover plate 12' by a double-sided tape 153, the photoreceptor 154 is located in the groove 104, and a groove wall and a groove bottom of the groove 104 are provided with the light semi-transmitting layer 123. Thus, the photoreceptor 154 can be effectively hidden, especially when the environment light is weak, the light semi-transmitting layer 123 can hide the photoreceptor 154 well.

A cover plate 12, 12' of a display device 10, 10' of the present application is disposed on a display screen 13, the cover plate 12, 12' is provided with a light shielding layer 122, the light shielding layer 122 is provided with a light transmitting area 103, and a photoreceptor 154 is disposed corresponding to the light transmitting area 103. Since the photoreceptor 154 is disposed under the cover plate 12, 12', the environment light can be sensed by the photoreceptor 154 only after penetrating the cover plate 12, 12' of the display device 10, 10', which improves the photographic properties and the accuracy of the photoreceptor 154, and makes the display device easier to assemble, and reduces assembly steps.

The preferred embodiments of the present application are described in detail above with reference to the accompanying drawings, but the present application is not limited to specific details in the foregoing embodiments. Various simple modifications may be performed to the technical solutions of the present application within the scope of the technical concept of the present application, and these simple modifications are within the protection scope of the present application. The specific technical features described in the foregoing specific embodiments may be combined in any suitable manner without contradiction. In order to avoid unnecessary repetition, the present application does not further illustrate various possible combinations.

What is claimed is:

1. A display device, comprising a cover plate, a display screen, a photoreceptor, and a control assembly, wherein the cover plate is disposed on the display screen, the cover plate is provided with a light shielding layer, the light shielding layer is provided with a light transmitting area, and the photoreceptor is disposed corresponding to the light transmitting area, wherein the control assembly comprises a flexible circuit board, one end of the flexible circuit board is disposed on the light shielding layer, and the photoreceptor is located between the flexible circuit board and the cover plate and connected to the flexible circuit board, wherein the cover plate is provided with a groove located in the light transmitting area, and one side of the photoreceptor away from the flexible circuit board is located in the groove.

2. The display device of claim 1, wherein the flexible circuit board is provided with a double-sided tape, one side of the double-sided tape is connected to the flexible circuit board, and the other side of the double-sided tape is connected to the cover plate.

3. The display device of claim 1, wherein the cover plate comprises a display area and a non-display area, the display area is located in an intermediate region of the cover plate, a light of an image displayed by the display screen is emitted from the display area of the cover plate, the non-display area is disposed around the display area, and the light shielding layer is disposed in the non-display area.

4. The display device of claim 2, wherein the double-sided tape is a foam tape.

5. The display device of claim 1, wherein the light shielding layer comprises a light semi-transmitting layer disposed in the light transmitting area.

6. The display device of claim 5, wherein the light semi-transmitting layer is provided on a groove wall and a groove bottom of the groove.

7. The display device of claim 5, wherein the light shielding layer further comprises an ink layer disposed around a circumferential direction of the light semi-transmitting layer.

8. The display device of claim 1, wherein the control assembly further comprises a control panel, and the display screen and the flexible circuit board are electrically connected to the control panel respectively.

9. The display device of claim 1, wherein the photoreceptor is configured to sense a light intensity of external environment, and wherein a brightness of the display screen is adjusted in response thereto.

10. The display device of claim 1, wherein the flexible circuit board is disposed directly on an ink layer of the light shielding layer.

11. The display device of claim 10, wherein the photoreceptor is on a same plane as the ink layer.

12. The display device of claim 1, wherein the flexible circuit board is positioned within the groove.

13. The display device of claim 1, wherein the flexible circuit board is positioned above a light semi-transmitting layer of the light shielding layer.

* * * * *